United States Patent
Brambilla et al.

(10) Patent No.: US 6,307,434 B1
(45) Date of Patent: Oct. 23, 2001

(54) CIRCUIT FOR ENSURING FULL SATURATION OF AMPLIFIERS OF A SINGLE INPUT CONFIGURED BRIDGE AMPLIFIER

(75) Inventors: Davide Brambilla, Rho; Giovanni Capodivacca, Gorla Maggiore, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/461,168

(22) Filed: Dec. 14, 1999

(30) Foreign Application Priority Data

Dec. 16, 1998 (IT) ............................... VA98A0026

(51) Int. Cl.⁷ ........................................ H03F 3/68
(52) U.S. Cl. .............................. 330/146; 330/84
(58) Field of Search .................... 330/146, 296, 330/75, 78, 84, 85

(56) References Cited

U.S. PATENT DOCUMENTS

| | | | |
|---|---|---|---|
| 4,254,380 | * 3/1981 | Guillien | 330/146 |
| 4,560,946 | * 12/1985 | Yokoyama | 330/146 |
| 4,758,796 | * 7/1988 | Verhoeven et al. | 330/146 |
| 4,791,381 | * 12/1988 | Lenz | 330/84 |
| 5,402,084 | * 3/1995 | Freiler et al. | 330/146 |
| 5,654,668 | * 8/1997 | Botti et al. | 330/146 |
| 5,903,189 | * 5/1999 | Huijser | 330/84 |

* cited by examiner

Primary Examiner—Robert Pascal
Assistant Examiner—Khanh Van Nguyen
(74) Attorney, Agent, or Firm—Lisa K. Jorgenson; Allen, Dyer, Doppelt, Milbrath & Gilchrist, P.A.

(57) ABSTRACT

A circuit for ensuring a complete saturation of both operational amplifiers of a single-input bridge amplifier is provided. A voltage divider is connected between the inverting inputs of the two amplifiers and a saturation current signal is injected on the intermediate node of the voltage divider. Such a saturation current signal is obtained through dedicated sensing devices of the state of saturation reached by the transistors of the output stages of both amplifiers of the single-input bridge amplifier.

20 Claims, 3 Drawing Sheets

CIRCUIT FOR ENSURING FULL SATURATION OF AMPLIFIERS OF A SINGLE INPUT CONFIGURED BRIDGE AMPLIFIER

FIELD OF THE INVENTION

The present invention relates in general to amplifiers and, more particularly, to single-input bridge amplifiers.

BACKGROUND OF THE INVENTION

In many applications such as audio applications, it may be useful, in terms of maximizing the output power, to use one or several pairs of amplifiers to drive the load in a bridge mode. FIG. 1 shows a typical single-input bridge configuration of a pair of single input operational amplifiers A and B. In the example shown, the noninverting input (+) of one of the two amplifiers is connected to ground, the B amplifier in the example, and the inverting inputs (−) of the two operational amplifiers A and B are connected with a resistor R2.

In order to maximize the output power, it is important to fully exploit the output voltage swing of both amplifiers of FIG. 1, when there are asymmetric characteristics of saturation of the two amplifiers A and B. By observing the scheme of FIG. 1, the gain of the amplifier A is:

$$Va=Vin*(1+R1/R2)$$

whereas the gain for the other amplifier B is:

$$Vb=-(R1/R2).$$

The B amplifier is not directly driven by the input signal, but, by the voltage BV1 present on the inverting input node (−) of the A amplifier. In these conditions, when the A amplifier reaches saturation, the voltage V1 remains at the reached value and the B amplifier may not follow the other to a state of saturation. This Phenomenon is illustrated in FIG. 2.

A commonly used approach is to make the gains of the two amplifiers substantially equal, eventually by using different values of resistance of the feedback resistors, R1, as shown for example in FIG. 3. If the following equation is satisfied, a simultaneous saturation of the two outputs Va and Vb will be ensured:

$$Va=1+R1a/R2=Vb=1R1b/R21.$$

However, owing to residual asymmetries of the resistors, and above all of the saturation characteristics of the two amplifiers A and B which may be different in terms of respectively high and low saturation characteristics, it is difficult to ensure an identical saturation of both.

SUMMARY OF THE INVENTION

In view of the prior art, an efficient circuit arrangement is provided which is capable of ensuring a complete saturation of both operational amplifiers of a single-input bridge amplifier, practically under any condition of operation. Essentially, this result is achieved by replacing the commonly used single resistor that is connected between the inverting inputs of the two amplifiers with a voltage divider, and by injecting a saturation current signal on the intermediate node of the voltage divider. Such a saturation current signal is obtained through dedicated sensing devices of the state of saturation reached by the transistors of the output stages of both amplifiers of the single-input bridge amplifier.

In practice, the currents that originate from these saturation sensing devices are added to the intermediate node of the voltage divider that connects the inverting inputs of the two amplifiers and act as an auxiliary driving signal that reconfirms the value of the input signal when the amplifier reaches the saturation state.

BRIEF DESCRIPTION OF THE DRAWINGS

The various aspects and advantages of the invention will be even more evident through the following description of an embodiment and by referring to the attached drawings, wherein.

DETAILED DESCRIPTION OF THE PREFERRED EMBODIMENTS

Figure 6:
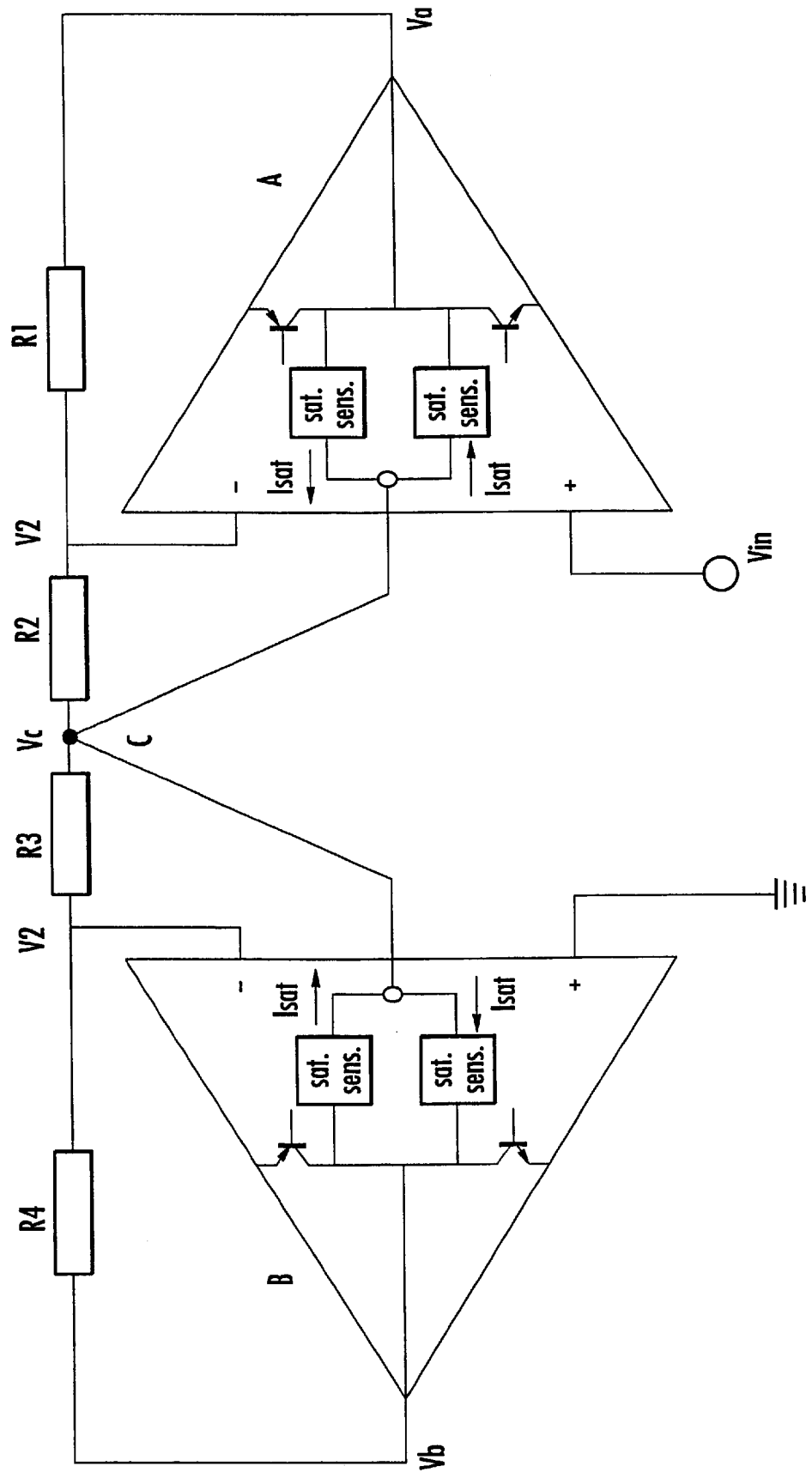

With reference to FIG. 6, it may be observed that each transistor of the output stage of both the operational amplifiers A and B is connected to a saturation sensor SAT. SENS. This sensor generates a saturation current signal I$_{SAT}$ for each amplifier, of sign and value that depend from the direction of level of saturation (toward the voltage supply or toward ground potential). The two saturation current signals are added on the intermediate node C of the voltage divider formed by the resistors R2 and R3 that connect the inverting inputs (−) of the two amplifiers A and B. The injection of an I$_{SAT}$ current corresponding to the difference between the saturation currents of the two final stages of the amplifiers A and B, on the inverting input of one of of the other amplifier, forces it to saturate.

By way of example, if the final stage of the amplifier A saturates downward toward ground potential, the resulting current I$_{SAT}$ forces a negative signal on the inverting input of the amplifier B (B2) which is forced to saturate upward. In practice, the I$_{SAT}$ currents sum on the node C and the resulting current provides for an auxiliary driving signal that confirms Vin when the A amplifier reaches saturation.

Figure 1:
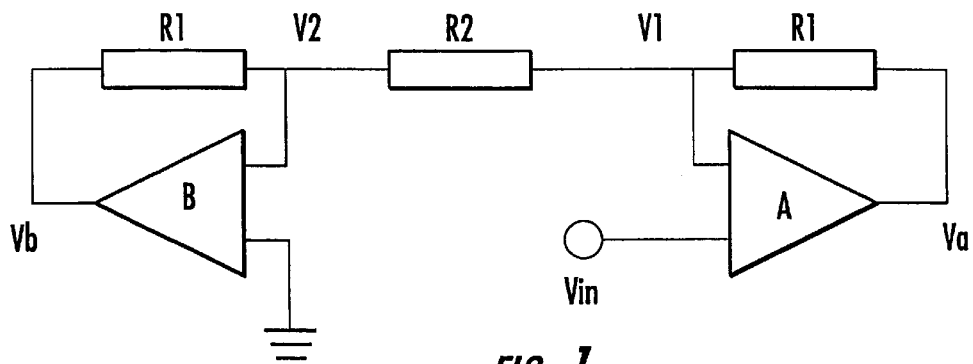
FIG. 1 shows a pair of operational amplifiers functioning in a single input configuration according to the prior art.
Figure 2:
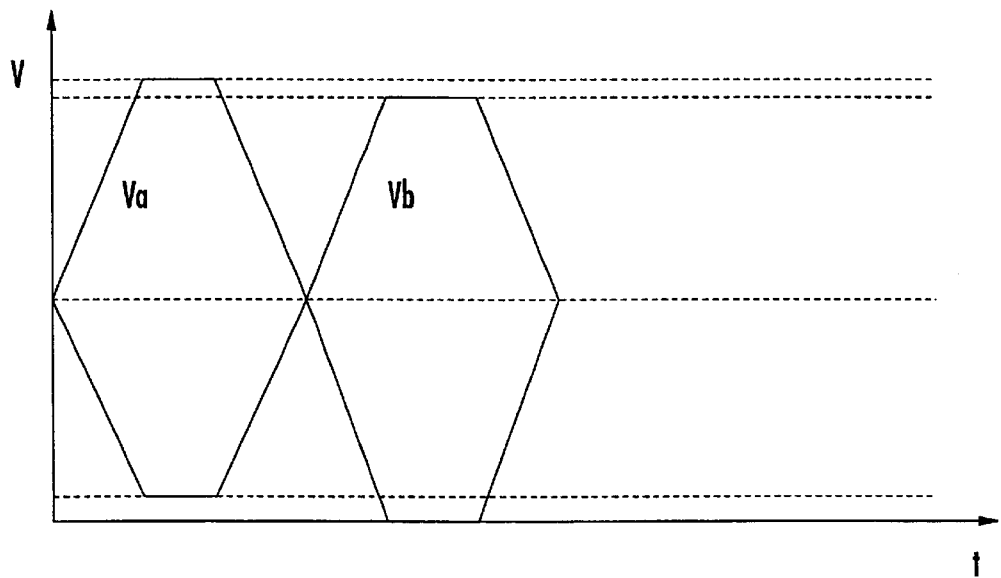
FIG. 2 highlights the problem of an asymmetric saturation characteristic between two amplifiers according to FIG. 1.
Figure 3:
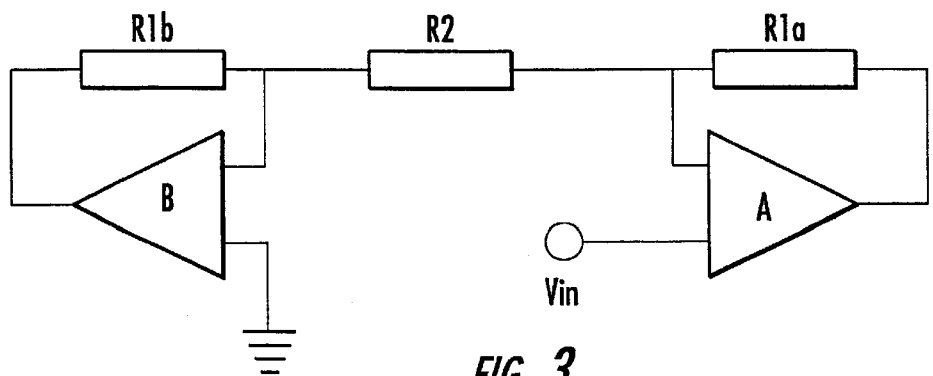
FIG. 3 shows a prior art compensating technique of eventual differences of the saturation characteristics.
Figure 4A:
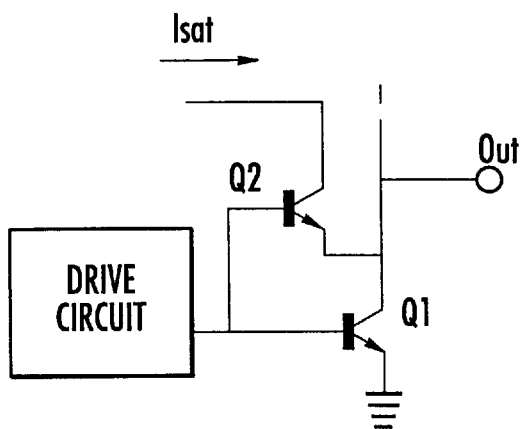
FIGS. 4A, 4B, 5 and 6 illustrate the circuit of the present invention.
Figure 4B:
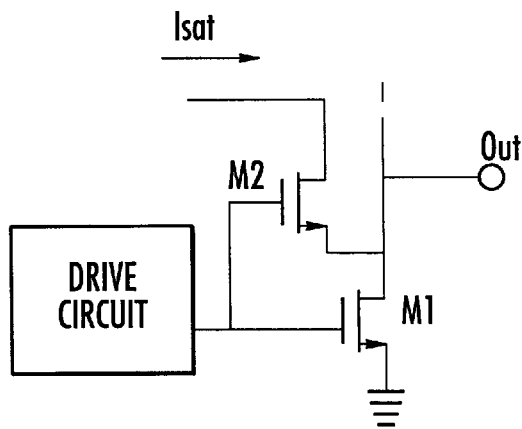
Figure 5:
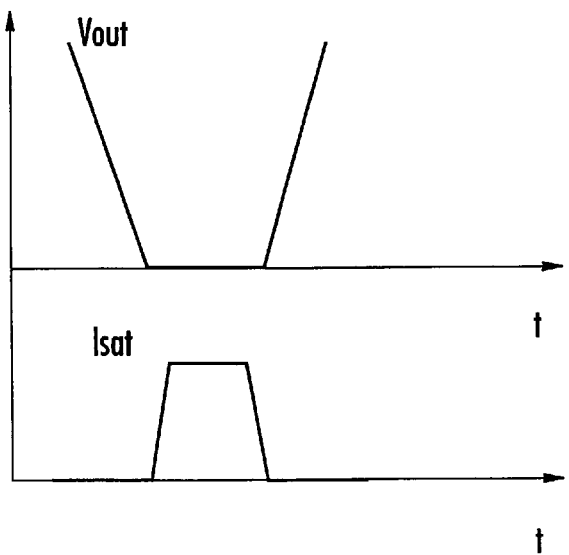

FIGS. 4A–4B show two examples for realizing the sensors SAT. SENS. If the amplifier employs bipolar junction power transistors, a saturation state of the NPN transistor Q1 of the final stage may be sensed by the use of an NPN transistor Q2 whose base is connected in common to the base of the transistor Q1 and the emitter is connected to the collector of the transistor Q1, as shown in FIG. 4A. The collector current will absorb a saturation current I$_{SAT}$ when the Q1 transistor saturates. As shown in FIG. 4B, the other example, which is functionally equivalent to the first example, relates to the case when the power transistors are of the field effect type. FIG. 5 illustrates the diagrams of the output voltage Vout and of the saturation current I$_{SAT}$.

Of course, the task of the circuit arrangement of the invention to force a symmetrically full saturation of both operational amplifiers A and B will be facilitated if a substantial matching of the resistive ratios of their respective networks is established, at least approximately. In other words, when the following equality is substantially satisfied:

$$R1/R2=R4/R3.$$

For an even higher approximation, the following relation should be verified:

$$1+R1/(R2+R3)=R4/(R2+R3).$$

In any case, within reasonable mismatch margins among resistors, the circuit of the invention will ensure a substantial symmetry of saturation.

That which is claimed is:

1. A bridge amplifier comprising:

a first operational amplifier and a second operational amplifier connected in a single-input configuration and a noninverting input of the second operational amplifier connected to a reference, each of the first and second operational amplifiers including an output stage having at least two transistors;

a first feedback resistor connecting an output of the first operational amplifier to an inverting input of the first operational amplifier;

a second feedback resistor connecting an output of the second operational amplifier to an inverting input of the second operational amplifier;

a resistive voltage divider being connected between the inverting inputs of the first and second operational amplifiers and having an intermediate node;

a first pair of sensors for sensing a state of saturation of the transistors of the output stage of the first operational amplifier; and a second pair of sensors for sensing a state of saturation of the transistors of the output stage of the second operational amplifier;

outputs of the first and second pairs of sensors being summed at the intermediate node of the resistive voltage divider.

2. A bridge amplifier according to claim 1, wherein the resistive voltage divider comprises first and second branch resistors defining the intermediate node therebetween, and wherein a ratio between the first feedback resistor and the first branch resistor is substantially equal to a ratio between the second feedback resistor and the second branch resistor.

3. A bridge amplifier according to claim 2, wherein values of the first and second feedback resistors (R1, R4) and of the first and second branch resistors (R2, R3) satisfy the following equation:

$$1+R1/(R2+R3)=R4/(R2+R3).$$

4. A bridge amplifier comprising:

a first operational amplifier and a second operational amplifier, a noninverting input of the second operational amplifier connected to a reference, and each of the first and second operational amplifiers including an output stage having at least one transistor;

a voltage divider being connected between inverting inputs of the first and second operational amplifiers and having an intermediate node; and at least one sensor for sensing a state of saturation of the at least one transistor of each output stage, an output of the at least one sensor being connected to the intermediate node of the voltage divider.

5. A bridge amplifier according to claim 4, further comprising:

a first feedback resistor connecting an output of the first operational amplifier to an inverting input of the first operational amplifier; and a second feedback resistor connecting an output of the second operational amplifier to an inverting input of the second operational amplifier.

6. A bridge amplifier according to claim 5, wherein the voltage divider comprises first and second branch resistors defining the intermediate node therebetween, and wherein a ratio between the first feedback resistor and the first branch resistor is substantially equal to a ratio between the second feedback resistor and the second branch resistor.

7. A bridge amplifier according to claim 6, wherein values of the first and second feedback resistors (R1, R4) and of the first and second branch resistors (R2, R3) satisfy the following equation:

$$1+R1/(R2+R3)=R4/(R2+R3).$$

8. A bridge amplifier according to claim 4, wherein the at least one transistor of each output stage of the first and second operational amplifiers comprises a pair of transistors; and wherein the at least one sensor comprises:

a first pair of sensors for sensing the state of saturation of the transistors of the output stage of the first operational amplifier; and a second pair of sensors for sensing the state of saturation of the transistors of the output stage of the second operational amplifier;

the outputs of the first and second pairs of sensors being summed at the intermediate node of the voltage divider.

9. A method of operating a bridge amplifier comprising a first operational amplifier and a second operational amplifier, a noninverting input of the second operational amplifier connected to a reference, and each of the first and second operational amplifiers including an output stage having at least one transistor, a first feedback resistor connects an output of the first operational amplifier to an inverting input of the first operational amplifier, a second feedback resistor connects an output of the second operational amplifier to an inverting input of the second operational amplifier, the method comprising the steps of:

providing a voltage divider between the inverting inputs of the first and second operational amplifiers;

sensing a state of saturation of the at least one transistor of the output stages of the first and second operational amplifiers; and providing the sensed state of saturation to an intermediate node of the voltage divider.

10. A method according to claim 9, wherein the voltage divider comprises first and second branch resistors defining the intermediate node therebetween, and wherein a ratio between the first feedback resistor and the first branch resistor is substantially equal to a ratio between the second feedback resistor and the second branch resistor.

11. A method according to claim 10, wherein values of the first and second feedback resistors (R1, R4) and of the first and second branch resistors (R2, R3) satisfy the following equation:

$$1+R1/(R2+R3)=R4/(R2+R3).$$

12. A method according to claim 9, wherein the at least one transistor of each output stage of the first and second operational amplifiers comprises a pair of transistors; and wherein the step of sensing comprises:

sensing the state of saturation of the transistors of the output stage of the first operational amplifier;

sensing the state of saturation of the transistors of the output stage of the second operational amplifier; and summing the sensed states of saturation at the intermediate node of the voltage divider.

13. A method of ensuring full saturation of first and second operational amplifiers of a single-input configured bridge amplifier comprising the steps of:
   sensing the state of saturation of at least one transistor of an output stage of the first operational amplifier;
   sensing the state of saturation of at least one transistor of an output stage of the second operational amplifier; and
   summing the sensed states of saturation at an intermediate node of a voltage divider connected between inverting inputs of the first and second operational amplifiers.

14. A method according to claim 13, wherein the first and second operational amplifiers each include a feedback resistor connecting an output to the inverting input thereof, and wherein the voltage divider comprises first and second branch resistors having the intermediate node therebetween, and wherein a ratio between the first feedback resistor and the first branch resistor is substantially equal to a ratio between the second feedback resistor and the second branch resistor.

15. A method according to claim 14, wherein values of the feedback resistors (R1, R4) and of the branch resistors (R2, R3) satisfy the following equation:

$$1+R1/(R2+R3)=R4/(R2+R3).$$

16. A method of making a bridge amplifier comprising the steps of:
   providing a first operational amplifier and a second operational amplifier, a noninverting input of the second operational amplifier connected to a reference, and each of the first and second operational amplifiers including an output stage having at least one transistor;
   connecting a voltage divider between inverting inputs of the first and second operational amplifiers and defining an intermediate node therebetween;
   providing at least one sensor for sensing a state of saturation of the at least one transistor of the output stages of the first and second operational amplifiers; and
   connecting an output of the sensor to the intermediate node of the voltage divider.

17. A method according to claim 16, further comprising the steps of:
   connecting a first feedback resistor between an output of the first operational amplifier and an inverting input of the first operational amplifier; and
   connecting a second feedback resistor between an output of the second operational amplifier and an inverting input of the second operational amplifier.

18. A method according to claim 17, wherein the voltage divider comprises first and second branch resistors having the intermediate node therebetween, and wherein a ratio between the first feedback resistor and the first branch resistor is substantially equal to a ratio between the second feedback resistor and the second branch resistor.

19. A bridge amplifier according to claim 18, wherein values of the first and second feedback resistors (R1, R4) and of the first and second branch resistors (R2, R3) satisfy the following equation:

$$1+R1/(R2+R3)=R4/(R2+R3).$$

20. A method according to claim 16, wherein the step of providing a sensor comprises:
   providing a first pair of sensors for sensing the state of saturation of the transistors of the output stage of the first operational amplifier; and
   providing a second pair of sensors for sensing the state of saturation of the transistors of the output stage of the second operational amplifier;
   the outputs of the first and second sensors being summed at the intermediate node of the voltage divider.

* * * * *